United States Patent
Chang et al.

(10) Patent No.: US 8,487,193 B2
(45) Date of Patent: Jul. 16, 2013

(54) CONDUCTIVE PLATE

(75) Inventors: Chih-Chieh Chang, Miao-Li County (TW); Jeah-Sheng Wu, Miao-Li County (TW); Chih-Han Chao, Miao-Li County (TW)

(73) Assignee: Chimei Innolux Corporation, Chu-Nan, Miao-Li County (TW)

( * ) Notice: Subject to any disclaimer, the term of this patent is extended or adjusted under 35 U.S.C. 154(b) by 288 days.

(21) Appl. No.: 12/826,710

(22) Filed: Jun. 30, 2010

(65) Prior Publication Data
US 2011/0024166 A1 Feb. 3, 2011

(51) Int. Cl.
*H05K 1/09* (2006.01)

(52) U.S. Cl.
USPC ........... 174/257; 174/255; 174/261; 977/742; 977/755

(58) Field of Classification Search
USPC ......... 174/250, 255, 257, 261, 268; 977/734, 977/742, 732, 755, 743, 952, 701, 723
See application file for complete search history.

(56) References Cited

U.S. PATENT DOCUMENTS

| 8,012,585 B2 * | 9/2011 | Liu et al. ...................... 428/408 |
| 2004/0047038 A1 * | 3/2004 | Jiang et al. .................... 359/486 |
| 2004/0051432 A1 * | 3/2004 | Jiang et al. .................... 313/311 |
| 2004/0053780 A1 * | 3/2004 | Jiang et al. .................... 502/182 |
| 2005/0209392 A1 | 9/2005 | Luo et al. |
| 2007/0296897 A1 * | 12/2007 | Liu et al. ...................... 349/123 |
| 2008/0245548 A1 * | 10/2008 | Fu et al. ....................... 174/117 A |
| 2009/0101488 A1 * | 4/2009 | Jiang et al. .................... 200/512 |
| 2010/0233472 A1 * | 9/2010 | Liu et al. ...................... 428/336 |

FOREIGN PATENT DOCUMENTS
WO 2007015710 A2 2/2007

* cited by examiner

*Primary Examiner* — Hoa C Nguyen
(74) *Attorney, Agent, or Firm* — Muncy, Geissler, Olds & Lowe, PLLC

(57) ABSTRACT

A conductive plate includes a substrate, an adhesive, and a conductive layer attached to the substrate through the adhesive. The conductive layer includes a plurality of conductive films, each of which includes a plurality of nanounits.

5 Claims, 7 Drawing Sheets

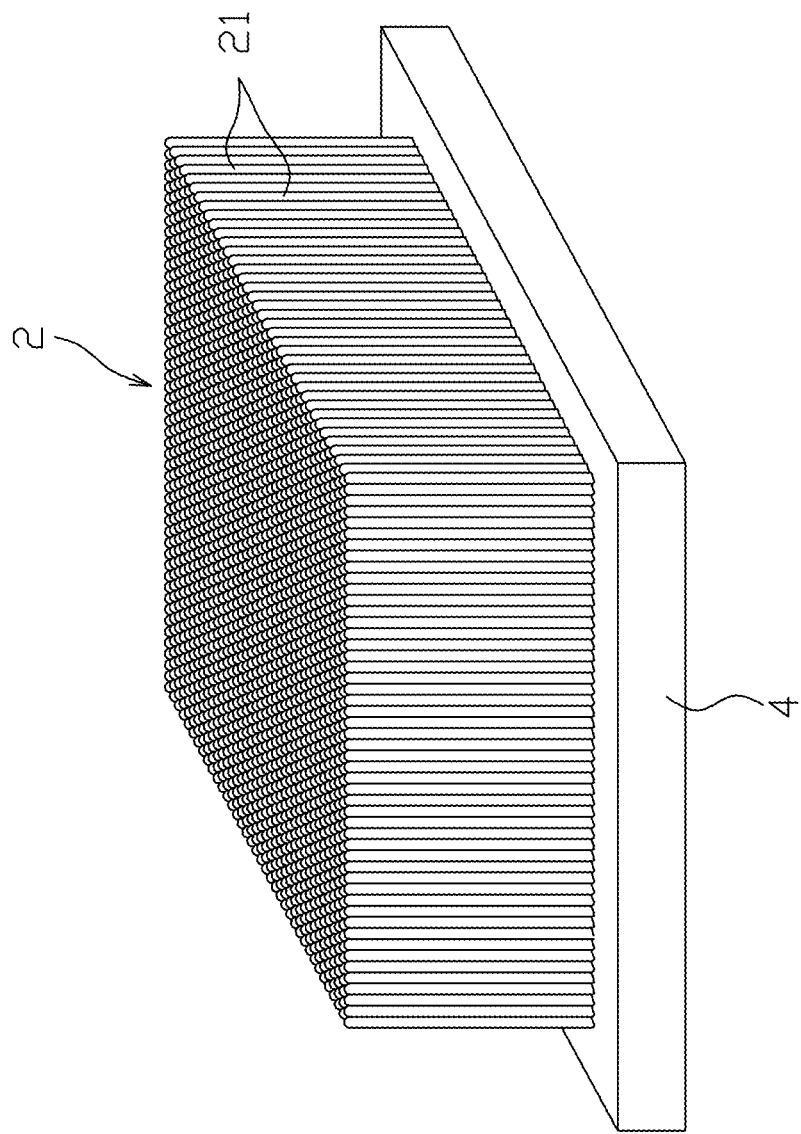

CONDUCTIVE PLATE

BACKGROUND OF THE DISCLOSURE

1. Field of the Disclosure

The present disclosure relates to a conductive plate, and more particularly to a conductive plate including a plurality of light-transmissible conductive films of a nanomaterial on a substrate.

2. Description of Related Art

Conventional conductive plates for a display panel normally include a transparent substrate and a transparent conductive film of indium tin oxide (ITO) formed on the substrate. The ITO film exhibits excellent transparency; however, formation of an ITO film on a large size substrate is difficult. Moreover, the surface resistivity of a large size ITO film is relatively large, which is unfavorable to manufacture large size display panels.

SUMMARY OF THE DISCLOSURE

Other objects and advantages of the present disclosure can be further illustrated by the technical features broadly embodied and described as follows.

According to one aspect of the present disclosure, there is provided a conductive plate that comprises: a substrate; an adhesive; and a conductive layer attached to the substrate through the adhesive. The conductive layer includes a plurality of conductive films, each of which includes a plurality of nanounits.

According to another aspect of the present disclosure, there is provided a conductive plate for a display panel that comprises: a substrate; and a light-transmissible conductive layer attached to the substrate. The conductive layer includes a plurality of light-transmissible conductive films, each of which includes a plurality of nanounits.

Other objects and advantages of the disclosure can be further illustrated by the technical features broadly embodied and described as follows.

BRIEF DESCRIPTION OF THE DRAWINGS

The components in the drawings are not necessarily drawn to scale, the emphasis instead being placed upon clearly illustrating the principles of at least one embodiment. In the drawings, like reference numerals designate corresponding parts throughout the various views.

FIGS. 2A and 2B are perspective views to illustrate consecutive steps of how a conductive film for the conductive plate of the first exemplary embodiment can be prepared.

DESCRIPTION OF EMBODIMENTS

Reference will now be made to the drawings to describe various embodiments in detail.

Figure 1:
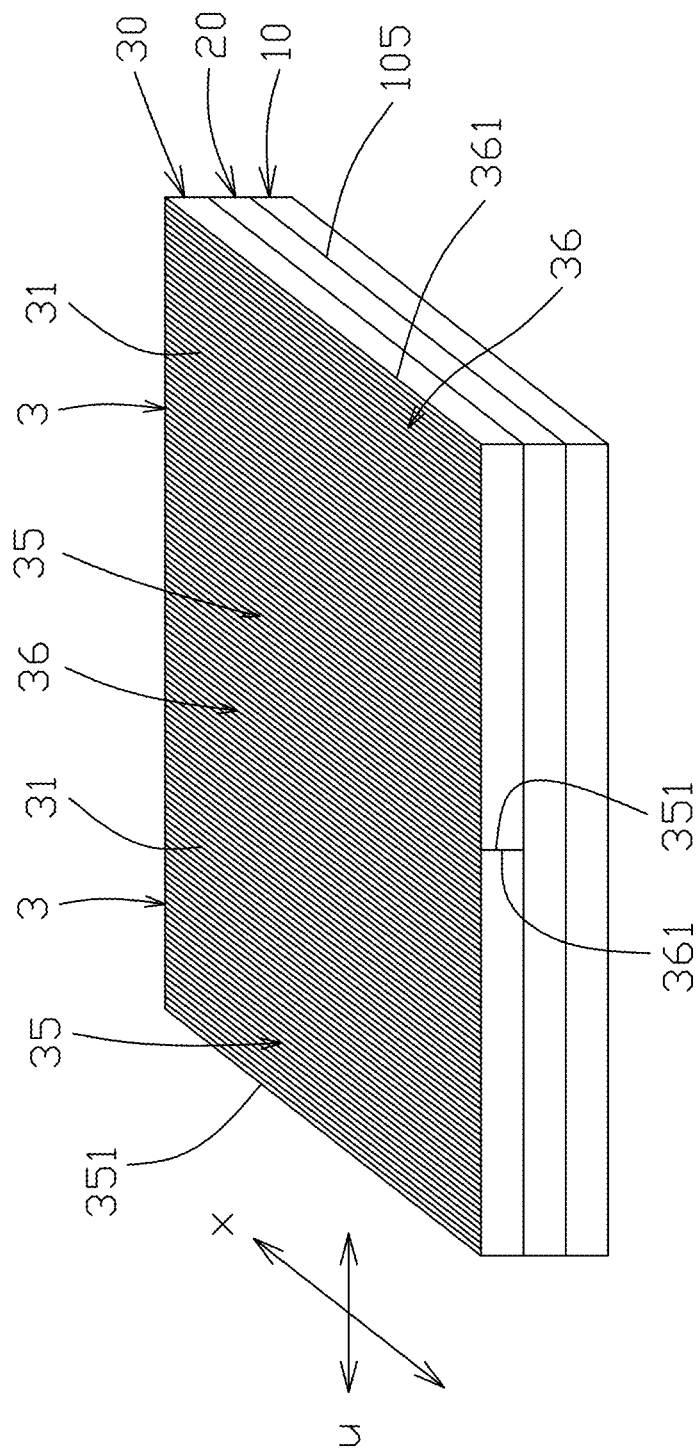
FIG. 1 is a perspective view of the first exemplary embodiment of a conductive plate of the present disclosure.

Referring to FIG. 1, in combination with FIGS. 2A to 2D, the first exemplary embodiment of a conductive plate of the present disclosure for a display panel includes a substrate 10 and a light-transmissible conductive layer 30 attached to an upper surface 105 of the substrate 10 through an adhesive 20. The conductive layer 30 includes a plurality of light-transmissible conductive films 3, each of which includes a plurality of nanounits 21.

The substrate 10 can be made of a transparent material, such as glass and a transparent polymeric material. Examples of the polymeric material include but are not limited to polymethylmethacrylate (PMMA) board, polyethylene terephthalate (PET) board, and polycarbonate (PC) board. In addition, the substrate 10 can also be made of an opaque material, such as metal substrates, semiconductor substrates, printed circuit boards, colored plastic boards, and plastic boards coated with a color layer.

Figure 2B:
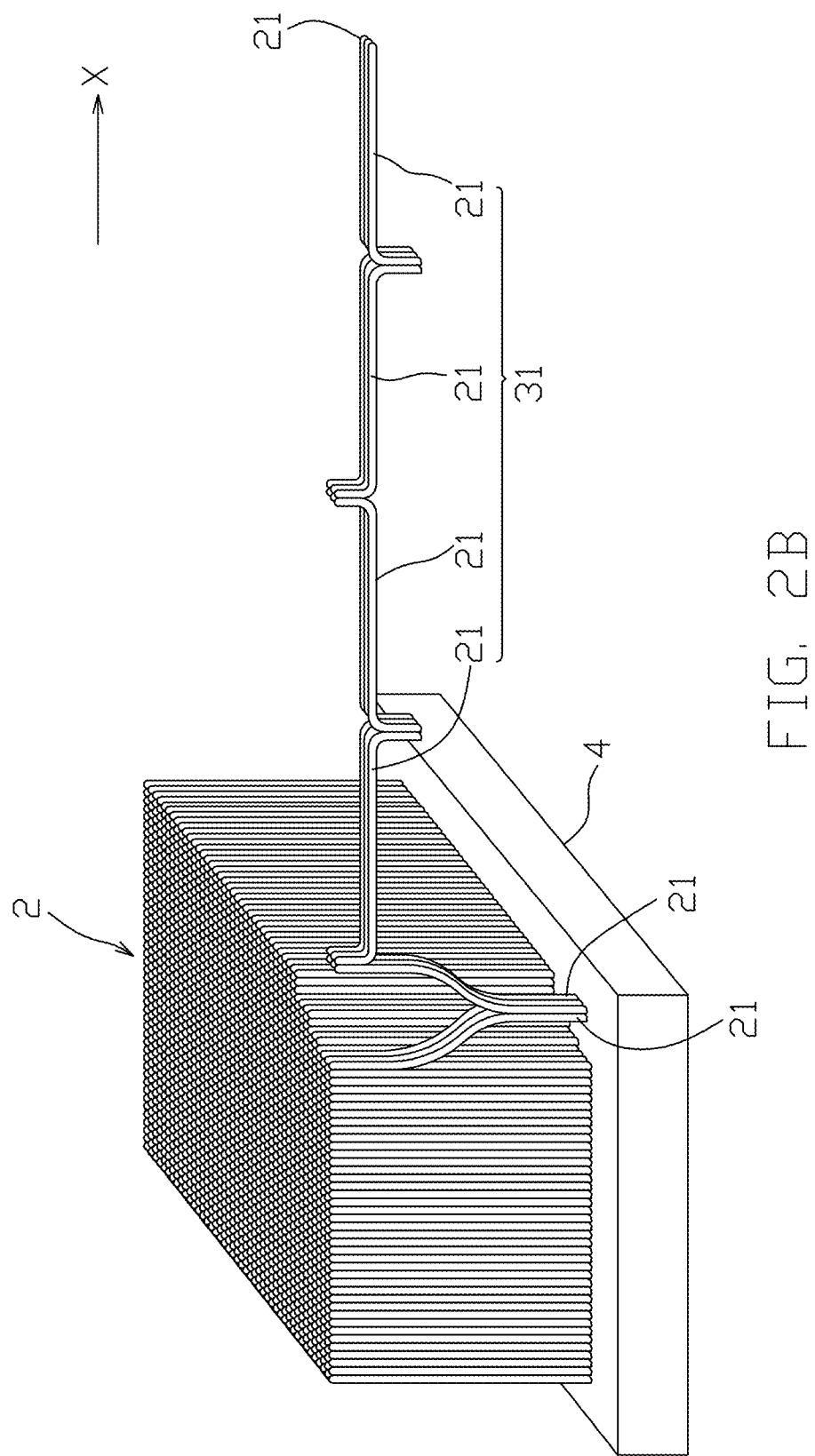
Figure 2C:
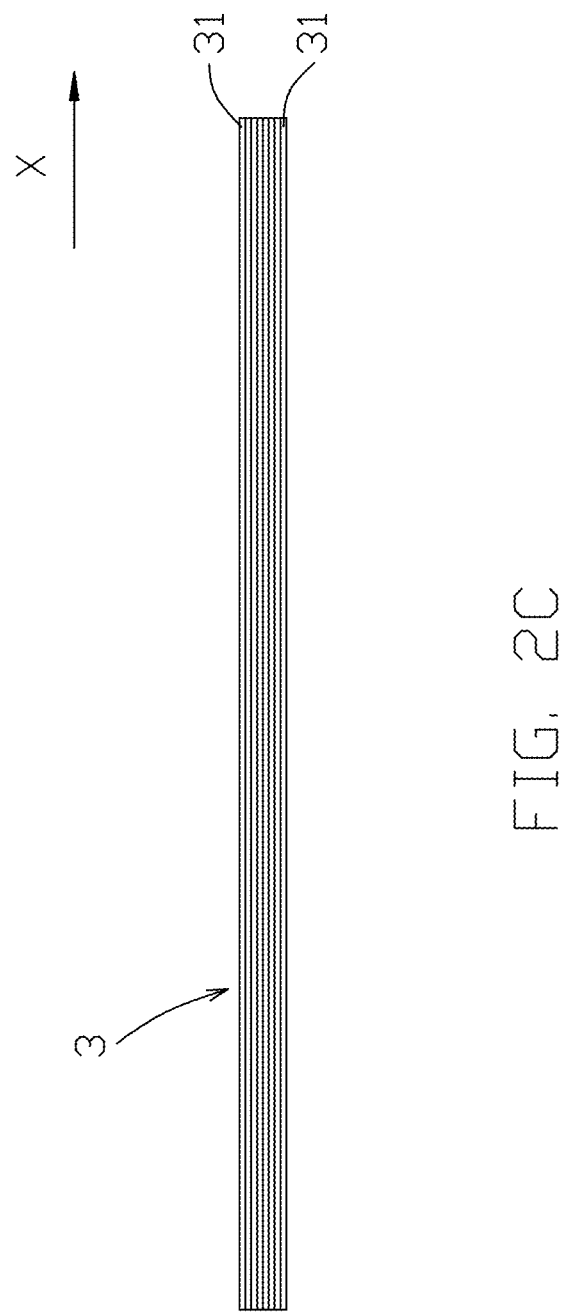
FIG. 2C is a schematic side view of the conductive film for the conductive plate of the first exemplary embodiment.
Figure 2D:
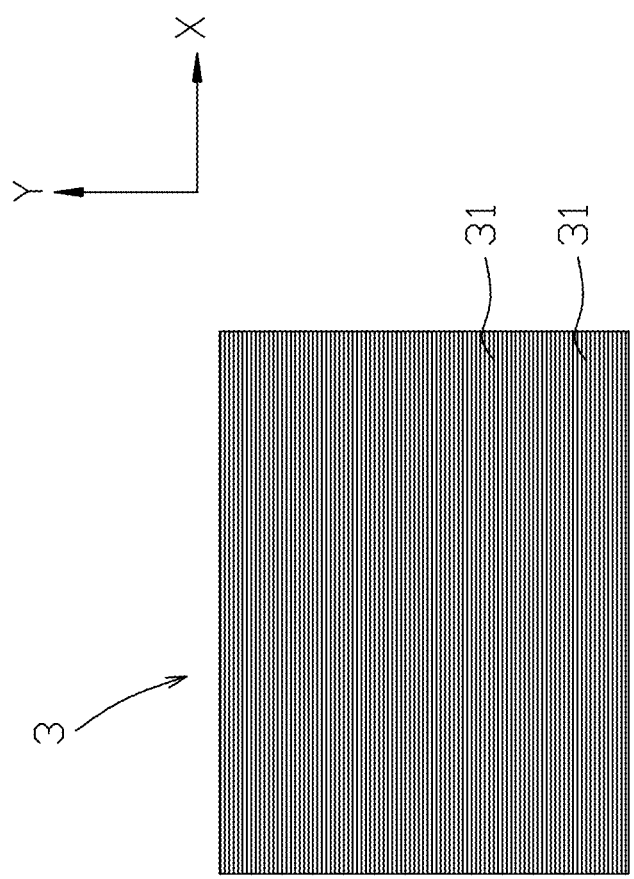
FIG. 2D is a schematic top view of the conductive film for the conductive plate of the first exemplary embodiment.

In the first exemplary embodiment, each of the conductive films 3 is made of a nanomaterial and includes strings 31 formed by interconnecting the nanounits 21 (see FIGS. 2A to 2D). The conductive film 3 exhibits electric anisotropy (i.e., the conductive film 3 exhibits different resistivities in different directions). The nanounits 21 of each of the strings 31 are connected in series to one another along a first direction (X) in an end-to-end manner. The nanounits 21 may be nanotube bundles, nanotubes (anisotropic in shape), or nanoparticles (isotropic in shape). In the embodiment, the interconnected nanounits 21 are carbon nanotube bundles. The strings 31 of the nanounits 21 extend along the first direction (X) (see FIG. 2B) and are distributed along a second direction (Y) different from the first direction (X) (see FIG. 2D). In this exemplary embodiment, the first and second directions (X, Y) are transverse to each other. The conductive film 3 has a much higher conductivity or a much lower resistivity in the first direction (X) than that in the second direction (Y). As illustrated in FIGS. 2A and 2B, the conductive film 3 is prepared by forming a cluster 2 of the nanounits 21 on a supporting substrate 4 through chemical vapor deposition techniques, laser vaporization vapor deposition techniques, arc discharge vaporization vapor deposition techniques, followed by removing the nanounits 21 in a pulling manner from the supporting substrate 4 to make them interconnected to form the strings 31 of the nanounits 21 and subsequently stretching the strings 31 of the nanounits 21 along the first direction (X) to form each conductive film 3. The nanounits 21 of each string 31 of each conductive film 3 are interconnected through Van der Waals' interaction.

Selection of the adhesive 20 depends on the type of curing to be used in bonding the conductive layer 30 to the substrate 10. For example, when the adhesive 200 is a light curable adhesive (such as an ultraviolet glue), the adhesive 200 is cured by irradiation with a light having a specified wavelength range; or when the adhesive 200 is a heat curable adhesive, the adhesive 200 is cured over an elevated temperature; or when the adhesive 200 is a light-heat curable adhesive, the adhesive 200 is cured by irradiation with the light having a specified wavelength range over an elevated temperature. In addition, the adhesive 20 can also be selected from conductive adhesives, such as a conductive polymer adhesive.

In the first exemplary embodiment, each of the conductive films 3 is adhesively bonded to the upper surface 105 of the substrate 10 through the adhesive 20. The adhesive 20 can be applied to the upper surface 105 of the substrate 10 through spin coating, screen printing or liquid drop coating techniques. Each of the conductive films 3 has first and second end portions 35, 36 that are opposite to each other in a film-extension direction (U). Each of the first and second end portions 35, 36 has an end face 351, 361. The conductive films 3 are arranged on the substrate 10 in a such manner that the strings 31 of all the conductive films 3 substantially extend along the first direction (X) which is different from the film-extension direction (U) (for instance, the first direction (X) and the film-extension direction (U) are transverse to each other) and that the conductive films 3 are distributed along the film-extension direction (U) and are connected in series to one another in an end-to-end manner. That is, the end face 351 of the first end portion 35 of each of the conductive films 3 is connected to the end face 361 of the second end portion 36 of an adjacent one of the conductive films 3, thereby permitting the conductive film 3 to have a large area and facilitating manufacture of a large size display panel.

Each of the conductive films 3 can be patterned through laser techniques so as to remove an undesired portion of the conductive film 3 and so as to improve the light transmissibility and/or the electric anisotropy (the surface resistivity ratio of the first direction (X) to the second direction (Y)) of the conductive film 3 before the conductive film 3 is attached to the substrate 10. The patterning can be conducted by moving a laser beam (not shown) above the conductive film 3 along either the first direction (X) or the second direction (Y) or along a predetermined path.

Figure 3:
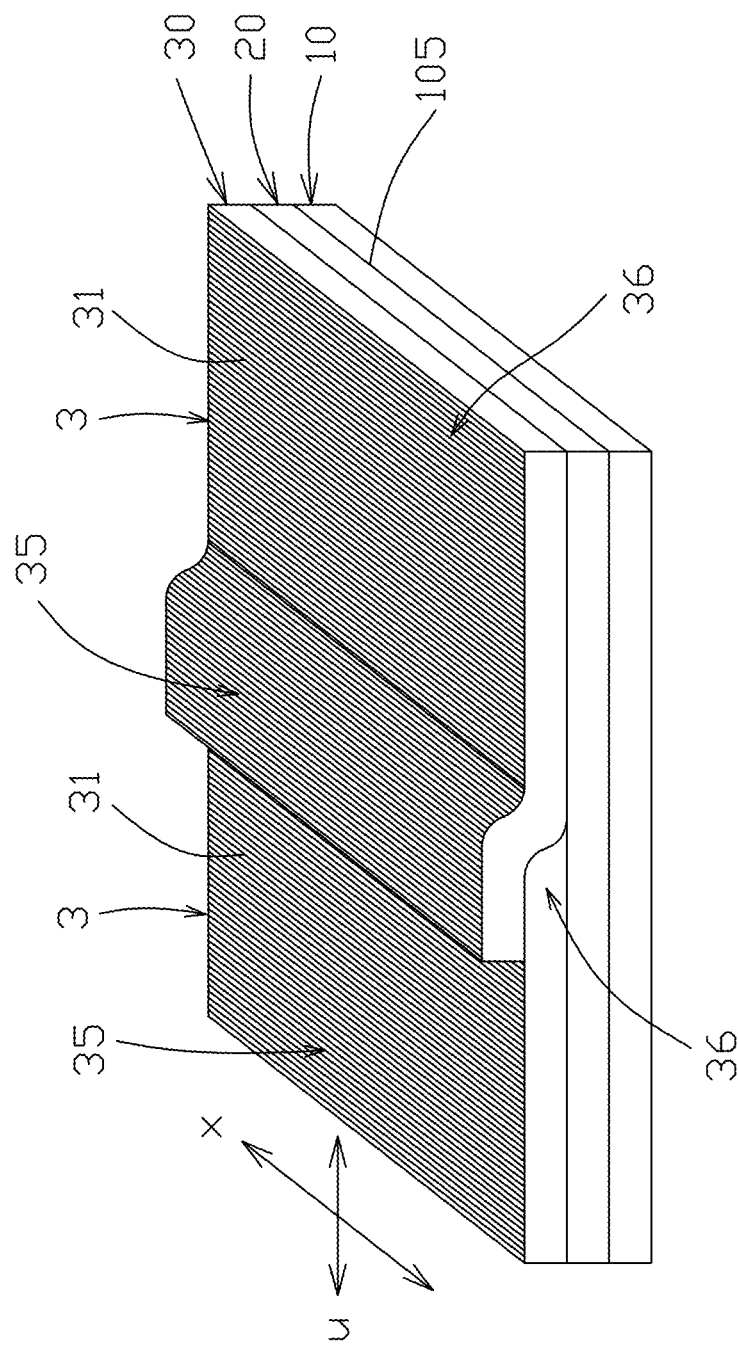
FIG. 3 is a perspective view of the second exemplary embodiment of a conductive plate of the present disclosure.

FIG. 3 illustrates the second exemplary embodiment of a conductive plate of the present disclosure. The conductive plate of the second exemplary embodiment differs from the previous exemplary embodiment in that the conductive films 3 are arranged on the substrate 10 in such a manner that the first end portion 35 of each of the conductive films 3 is stacked on and is attached to the second end portion 36 of an adjacent one of the conductive films 3. The arrangement of the conductive films 3 in this exemplary embodiment aims to overcome a potential problem of the first exemplary embodiment that the connection between the end face 351 of the first end portion 35 of each of the conductive films 3 and the end face 361 of the second end portion 36 of an adjacent one of the conductive films 3 is likely to be ruined due to undesired shrinking of the conductive films 3 (note that each conductive film 3 is formed through a stretching process). The stacking of the first and second end portions 35, 36 can result in a decrease in the light transmissibility at the overlapping area. Hence, a larger portion of the first and second end portions 35, 36 of each of the conductive films 3 is removed than that of the remainder of the conductive film 3 through the laser treatment so as to alleviate the adverse effect on the light transmissibility at the stacked first and second end portions 35, 36.

Figure 4:
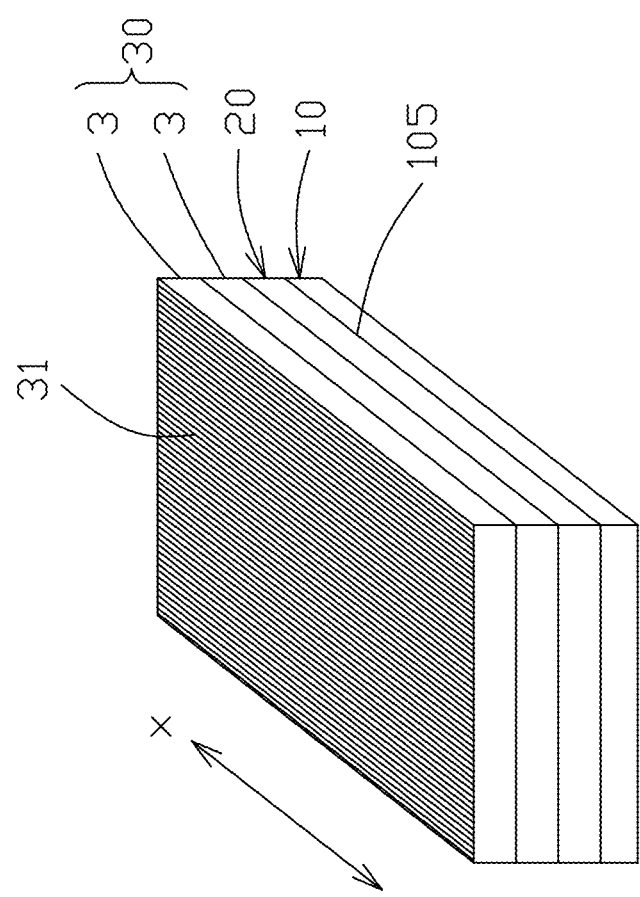
FIG. 4 is a perspective view of the third exemplary embodiment of a conductive plate of the present disclosure.

FIG. 4 illustrates the third exemplary embodiment of a conductive plate of the present disclosure. The conductive plate of the third exemplary embodiment differs from the previous exemplary embodiments in that the conductive films 3 are adhesively stacked one another to form into a stack that defines the conductive layer 30. The stack is attached to the surface 105 of the substrate 10 through the adhesive 20. The conductive films 3 may also be attached to one another through the adhesive 20. In this exemplary embodiment, the strings 31 of all the conductive films 3 substantially extend along the same direction (X). The surface resistivity of the conductive layer 30 thus formed can be reduced, thereby increasing the maximum transmission current value of the conductive layer 30.

In summary, by arranging a plurality of the conductive films 3 on the substrate 10 to form into the conductive layer 30 as illustrated by the previous exemplary embodiments, large size conductive plates with low resistance can be easily formed.

It is to be understood that even though numerous characteristics and advantages of the present embodiments have been set forth in the foregoing description, together with details of the structures and functions of the embodiments, the disclosure is illustrative only; and that changes may be made in detail, especially in matters of shape, size, and arrangement of parts, within the principles of the embodiments, to the full extent indicated by the broad general meaning of the terms in which the appended claims are expressed.

What is claimed is:

1. A conductive plate for a display panel, comprising:
   a substrate; and
   a light-transmissible conductive layer attached to said substrate through an adhesive, and including a plurality of conductive films each being produced by the steps of:
      forming on a supporting substrate a cluster of nanounits which are juxtaposed and interconnected to one another in first and second directions that are transverse to each other; and
      applying a pulling force to pull said nanounits out from said cluster along the first direction such that said nanounits are end-to-end connected along the first direction, so as to form a plurality of strings that are juxtaposed and interconnected to one another in the second direction, thereby forming a respective one of said conductive films,
   wherein each of said conductive films is disposed on said substrate and has first and second end portions that are opposite to each other in a film-extension direction that is transverse to the first direction, such that said second end portion of one of said conductive films is overlapped with said first end portion of an adjacent one of said conductive films along the film-extension direction, so as to prevent formation of a gap between each adjacent pair of said first and second end portions due to a stress relaxation of at least one of said conductive films as a result of the pulling force applied to said nanounits during formation of said conductive films.

2. The conductive plate of claim 1, wherein each of said conductive films exhibits electric anisotropy.

3. The conductive plate of claim 1, wherein said nanounits are isotropic in shape.

4. The conductive plate of claim 1, wherein said nanounits are carbon nanotube bundles.

5. The conductive plate of claim 1, wherein each of said conductive films is patterned through laser techniques.

* * * * *